United States Patent
Wei et al.

(10) Patent No.: US 12,076,831 B2
(45) Date of Patent: Sep. 3, 2024

(54) CHEMICAL MECHANICAL POLISHING APPARATUS AND METHOD

(71) Applicant: Taiwan Semiconductor Manufacturing Company, Ltd., Hsinchu (TW)

(72) Inventors: Yu-Chen Wei, New Taipei (TW); Jheng-Si Su, Zhubei (TW); Shih-Ho Lin, Jhubei (TW); Jen-Chieh Lai, Tainan (TW); Chun-Chieh Chan, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/308,878

(22) Filed: Apr. 28, 2023

(65) Prior Publication Data

US 2023/0264317 A1    Aug. 24, 2023

Related U.S. Application Data

(60) Continuation of application No. 17/711,724, filed on Apr. 1, 2022, now Pat. No. 11,673,223, which is a
(Continued)

(51) Int. Cl.
*B24B 37/005*    (2012.01)
*B24B 37/04*    (2012.01)
(Continued)

(52) U.S. Cl.
CPC .......... *B24B 37/20* (2013.01); *B24B 37/005* (2013.01); *B24B 37/04* (2013.01); *B24B 37/32* (2013.01);
(Continued)

(58) Field of Classification Search
CPC ....... B24B 37/005; B24B 37/30; B24B 37/32; B24B 37/34; B24B 53/007; B24B 53/017
(Continued)

(56) References Cited

U.S. PATENT DOCUMENTS 4,656,454 A    4/1987    Rosenberger
6,224,472 B1 *    5/2001    Lai ..................... B24B 37/32
                                                            451/288
(Continued)

FOREIGN PATENT DOCUMENTS

JP    2004071667 A  *  3/2004

*Primary Examiner* — Eileen P Morgan
(74) *Attorney, Agent, or Firm* — Birch, Stewart, Kolasch & Birch, LLP

(57) ABSTRACT

A chemical mechanical polishing (CMP) apparatus is provided, including a polishing pad and a polishing head. The polishing pad has a polishing surface. The polishing head is configured to hold a wafer in contact with the polishing surface during the polishing process. The polishing head includes a retaining ring, at least one fluid channel, and a vacuum pump. The retaining ring is arranged along the periphery of the polishing head and configured to retain the wafer. The at least one fluid channel is provided inside the polishing head, wherein the retaining ring includes a bottom surface facing the polishing surface and a plurality of holes in fluid communication with the bottom surface and the at least one fluid channel. The vacuum pump is fluidly coupled to the at least one fluid channel.

20 Claims, 14 Drawing Sheets

Related U.S. Application Data division of application No. 15/904,774, filed on Feb. 26, 2018, now Pat. No. 11,292,101.

(60) Provisional application No. 62/589,802, filed on Nov. 22, 2017.

(51) Int. Cl.

| | | |
|---|---|---|
| *B24B 37/20* | (2012.01) | |
| *B24B 37/32* | (2012.01) | |
| *B24B 49/10* | (2006.01) | |
| *B24B 49/16* | (2006.01) | |
| *B24B 49/18* | (2006.01) | |
| *B24B 53/00* | (2006.01) | |
| *B24B 53/007* | (2006.01) | |
| *B24B 53/017* | (2012.01) | |
| *H01L 21/321* | (2006.01) | |

(52) U.S. Cl.
CPC ............. *B24B 49/10* (2013.01); *B24B 49/16* (2013.01); *B24B 49/18* (2013.01); *B24B 53/001* (2013.01); *B24B 53/017* (2013.01); *H01L 21/3212* (2013.01)

(58) Field of Classification Search
USPC ... 451/41, 56, 285, 287, 289, 388, 397, 398, 451/444
See application file for complete search history.

(56) References Cited

U.S. PATENT DOCUMENTS

| | | | |
|---|---|---|---|
| 6,293,855 B1 | 9/2001 | Yoshida et al. | |
| 6,402,598 B1 * | 6/2002 | Ahn | H01L 21/67051 451/41 |
| 6,419,567 B1 * | 7/2002 | Glashauser | B24B 57/02 451/259 |
| 6,443,826 B1 * | 9/2002 | Yang | B24B 37/32 451/388 |
| 6,517,414 B1 | 2/2003 | Tobin et al. | |
| 6,659,116 B1 | 12/2003 | Williams et al. | |
| 6,845,778 B2 | 1/2005 | Boyd et al. | |
| 7,544,113 B1 | 6/2009 | Benner | |
| 9,362,129 B2 | 6/2016 | Miyazaki et al. | |
| 9,539,699 B2 | 1/2017 | Shinozaki | |
| 10,532,445 B2 | 1/2020 | Sekiya | |
| 2001/0006870 A1 | 7/2001 | Moore | |
| 2003/0183246 A1 | 10/2003 | Boyd et al. | |
| 2005/0252535 A1 | 11/2005 | Nishioka et al. | |
| 2007/0049179 A1 | 3/2007 | Chandrasekaran | |
| 2008/0004743 A1 | 1/2008 | Goers et al. | |
| 2010/0311309 A1 | 12/2010 | Shinozaki | |
| 2011/0275289 A1 | 11/2011 | Seo et al. | |
| 2012/0021671 A1 * | 1/2012 | McReynolds | B24B 37/042 451/6 |
| 2012/0100779 A1 | 4/2012 | Dhandapani et al. | |
| 2013/0122783 A1 | 5/2013 | Menk et al. | |
| 2014/0065931 A1 | 3/2014 | Shinozaki | |
| 2014/0349552 A1 | 11/2014 | Nagai et al. | |
| 2016/0074994 A1 | 3/2016 | Shinozaki | |
| 2016/0172221 A1 | 6/2016 | Takahashi et al. | |
| 2016/0184961 A1 | 6/2016 | Shinozaki | |
| 2017/0144265 A1 | 5/2017 | Takeda | |
| 2018/0093363 A1 | 4/2018 | Shinozaki | |
| 2018/0345454 A1 | 12/2018 | Chen et al. | |
| 2019/0152016 A1 * | 5/2019 | Wei | B24B 49/16 |
| 2019/0176291 A1 * | 6/2019 | Yang | H01L 21/68785 |
| 2020/0185231 A1 * | 6/2020 | Kim | B24B 57/00 |
| 2020/0238473 A1 * | 7/2020 | Yang | H01L 21/304 |
| 2024/0066664 A1 * | 2/2024 | Chang | B24B 57/02 |

\* cited by examiner

CHEMICAL MECHANICAL POLISHING APPARATUS AND METHOD

CROSS REFERENCE TO RELATED APPLICATIONS

This application is a Continuation of U.S. application Ser. No. 17/711,724, filed on Apr. 1, 2022, which is a Divisional of U.S. application Ser. No. 15/904,774, filed on Feb. 26, 2018, which claims priority of U.S. Provisional Patent Application No. 62/589,802, filed on Nov. 22, 2017, the entirety of which is incorporated by reference herein.

BACKGROUND

Chemical Mechanical Polishing (CMP) is one type of processing used in the manufacture of semiconductor devices. CMP is a process used to smooth and planarize the surfaces of wafers using a combination of chemical and mechanical forces. Integrated circuit (IC) dies in wafer form are placed into a chamber of a CMP apparatus and are planarized or polished at various stages of the CMP process. CMP processes may be used to form planar surfaces on dielectric layers, semiconductor layers, and conductive material layers of a wafer, for example.

CMP apparatuses typically include a rotatable platen with a polishing pad attached thereto. In some CMP processes, a semiconductor wafer is placed upside down against the polishing pad using a predetermined amount of pressure. A liquid dispersion referred to as slurry, which contains chemicals and microabrasive grains, is applied to the polishing pad during the CMP process while the wafer is held against the rotating polishing pad. The wafer is also rotated in some applications. A pad conditioning process can be carried out either during the polishing process or after the polishing process, to remove polished debris from the pad/polishing surface to improve the lifespan of the polishing pad.

Although existing apparatuses and methods for a CMP process have been generally adequate for their intended purposes, they have not been entirely satisfactory in all respects. Consequently, it would be desirable to provide a solution for polishing wafers in CMP apparatuses.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
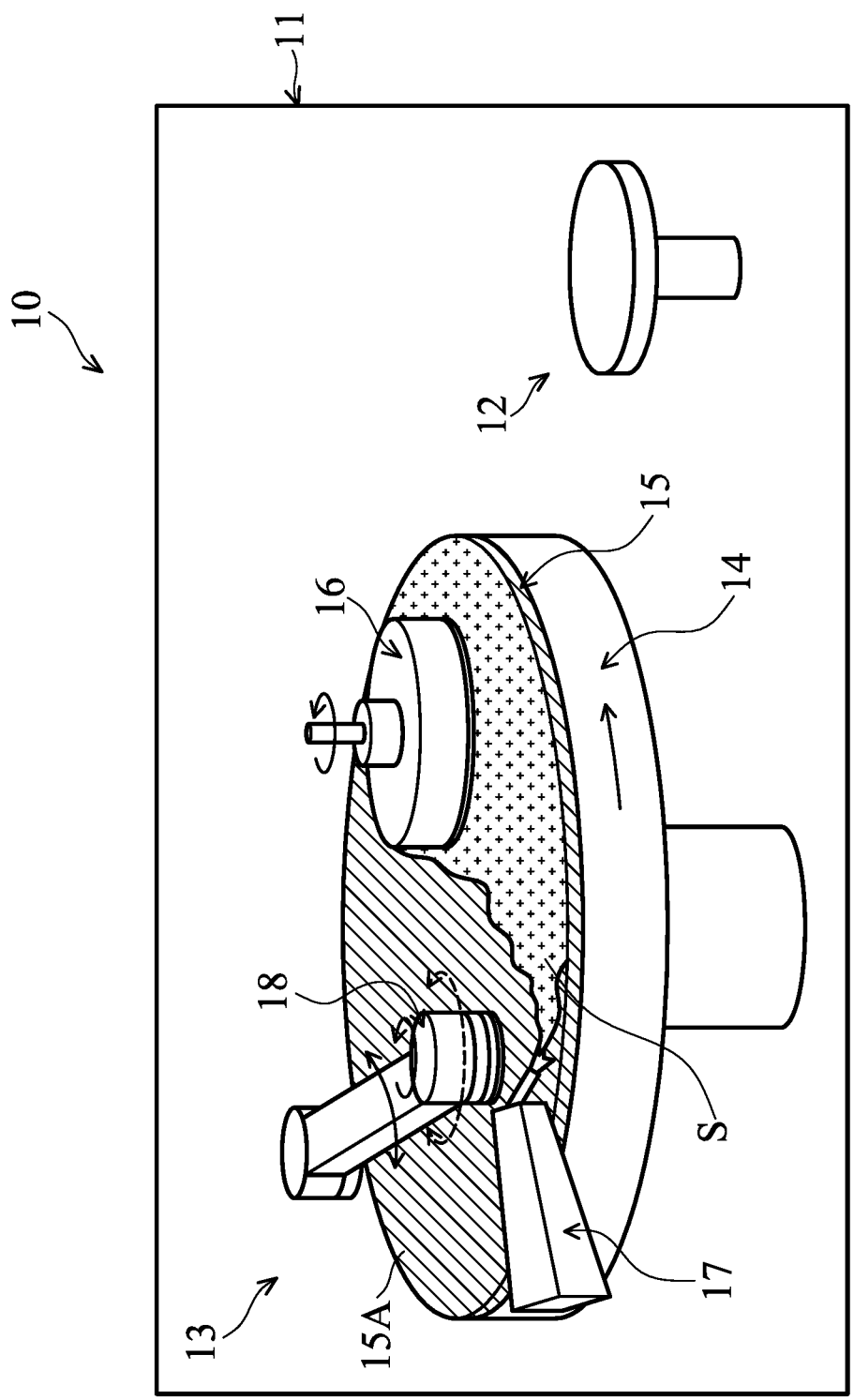
FIG. 1 schematically illustrates a Chemical Mechanical Polishing (CMP) apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 schematically illustrates a perspective view of a part of a Chemical Mechanical Polishing (CMP) apparatus 10 in accordance with some embodiments of the present disclosure. The CMP apparatus 10 is used to polish the top surface or device side of a semiconductor wafer (not shown in FIG. 1) during the fabrication of semiconductor devices on the wafer. A wafer is planarized or smoothed one or more times by the CMP apparatus 10 during a CMP process in order for the top surface of the wafer to be as flat as possible. The wafer may be a production wafer or a test wafer, for example. In accordance with some embodiments, the wafer has diameter in a range from about 150 millimeters (mm) to about 450 mm, or even a larger diameter.

The CMP apparatus 10 includes a processing chamber 11 which provides a sealed, contained system for the components of the CMP apparatus 10 as described below. One or more load ports (not shown) can be coupled to the chamber wall of the processing chamber 11 for allowing one or more wafers to enter and exit the CMP apparatus 10. The wafers in the processing chamber 11 can be transferred onto and off a wafer load/unload station 12 using a robotic wafer transfer system (not shown). The wafer load/unload station 12 is used for the loading and unloading wafers of onto and from a wafer polishing station 13 that is used for chemically and mechanically polishing material layers on the wafers. As shown in FIG. 1, the wafer polishing station 13 includes a polishing platen 14, a polishing pad 15, a polishing head 16, a slurry dispenser 17, and a pad conditioner 18.

The slurry dispenser 17 is operable to dispense slurry S onto the polishing pad 15 during the CMP process. The slurry S includes reactive chemicals that can react with the top surface of the wafer. Furthermore, the slurry S includes abrasive particles for mechanically polishing the wafer. In accordance with some embodiments, the slurry dispenser 17 is coupled to a reservoir (not shown) that holds a supply of the slurry S. Moreover, the slurry dispenser 17 comprises a nozzle for dispensing the slurry S and a pivotable arm coupled to the nozzle. The pivotable arm is driven by a mechanism, such as a motor (not shown), and hence the slurry dispenser 17 can be moved towards the polishing pad 15 during the CMP process (as shown in FIG. 1) and away from the polishing pad 15 after the CMP process.

The polishing pad 15 is formed of a material that is hard enough to allow the abrasive particles in the slurry S to mechanically polish the wafer, which is placed under the polishing head 16, during the CMP process. On the other hand, the polishing pad 15 is also soft enough so that it does not substantially scratch the wafer. In accordance with some embodiments, the polishing pad 15 is attached to the polishing platen 14 by an adhesive film, adhesive, or glue, for example. During the CMP process, the polishing platen 14 is rotated by a mechanism, such as a shaft coupled a rotating motor (not shown), and hence the polishing pad 15 fixed thereon is also rotated along the polishing platen 14.

The polishing head 16 is configured to hold and move a wafer in various stages of the CMP process. For example, as a wafer to be polished is transferred into the processing chamber 11 and moved onto the wafer load/unload station 12, the polishing head 16 is driven by a mechanism, such as a pivotable arm and a motor (not shown), to move over the wafer. The wafer is then picked up by the polishing head 16. In accordance with some embodiments, the polishing head 16 includes a plurality of air passages (not shown), in which a vacuum may be generated. By vacuuming the air passages, the wafer is sucked up and held on the bottom of the polishing head 16 for the transportation of the wafer to the polishing pad 15. After the polishing of the wafer on the polishing pad 15 is completed, the polished wafer is further moved by the polishing head 16 from the polishing pad 15 to the wafer load/unload station 12 so that it is ready to be transferred out of the processing chamber 11.

During the CMP process, the polishing head 16 is also operable to provide a predetermined amount of pressure to press the wafer against the polishing pad 15 for mechanical polishing. For example, after the polishing head 16 is moved over and also pressed against the polishing pad 15, the vacuuming in the air passages is then turned off, and hence the wafer is no longer sucked up. Afterwards, a flexible membrane (not shown) disposed between the bottom of the polishing head 16 and the wafer is inflated, for example, by pumping air into zones in the flexible membrane, and hence the inflated flexible membrane presses the wafer against the polishing pad 15.

During the CMP process, the polishing head 16 is also rotated by a mechanism, such as a shaft coupled a rotating motor (not shown), causing the rotation of the wafer affixed to the polishing head 16. In accordance with some embodiments, as shown in FIG. 1, the polishing head 16 and the polishing pad 15 rotate in the same direction (clockwise or counter-clockwise). In accordance with alternative embodiments, the polishing head 16 and the polishing pad 15 rotate in opposite directions. With the rotation of the polishing pad 15 and the polishing head 16, the slurry S flows between the wafer and the polishing pad 15 through surface grooves (not shown) formed on the polishing surface 15A of the polishing pad 15. Through the chemical reaction between the reactive chemicals in the slurry S and the top surface of the wafer, and further through the mechanical polishing (i.e. through contact and friction between the top surface of the wafer and the polishing surface 15A), the top surface of the wafer is planarized.

While not shown in FIG. 1, a circular retaining ring 161 (see FIGS. 7 and 8) is provided along the periphery of the bottom of the polishing head 16 and will be pressed against the polishing surface 15A during the CMP process. The retaining ring 161 is used to retain the wafer W (FIG. 7) in case the wafer W becomes offset from the central axis of the polishing head 16, so that the wafer W is not spun off from the polishing pad 15 during the polishing process. The bottom surface of the retaining ring 161 may have some grooves G which allow the slurry S to get in and out of the retaining ring 161 during the rotation of the polishing head 16 (and the retaining ring). In accordance with some embodiments, the retaining ring 161 comprises a wear-resistant material, which may be plastic, ceramic, polymer, etc. For example, the retaining ring 161 is formed of polyphenylene sulfide (PPS), polyetheretherketone (PEEK), or a mix of these materials and other materials such as polymers (for example, polyurethane, polyester, polyether, or polycarbonate).

The pad conditioner 18 is configured and operable to perform a conditioning process to remove polished debris and undesirable by-products from the polishing surface 15A of the polishing pad 15 during the CMP process. In accordance with some embodiments, the pad conditioner 18 includes a conditioning disk 18A (see FIG. 2) including embedded or encapsulated cut diamond particles on a substrate. The conditioning disk 18A comes into contact with the polishing surface 15A (for performing the conditioning process) when the polishing pad 15 is to be conditioned, for example, during the polishing process as previously discussed or after the polishing process. During the conditioning process, both the polishing pad 15 and the conditioning disk 18A rotate, and the conditioning disk 18A also sweeps back and forth across the polishing surface 15A, so that the protrusions or cutting edges of the conditioning disk 18A move relative to the polishing surface 15A, thereby removing polished debris and undesirable by-products from the polishing surface 15A and re-opening the surface grooves on the polishing surface 15A (i.e. re-texturizing the polishing surface 15A). Consequently, the cleanliness of the polishing surface 15A is maintained and the lifetime of the polishing pad 15 is prolonged.

Figure 2:
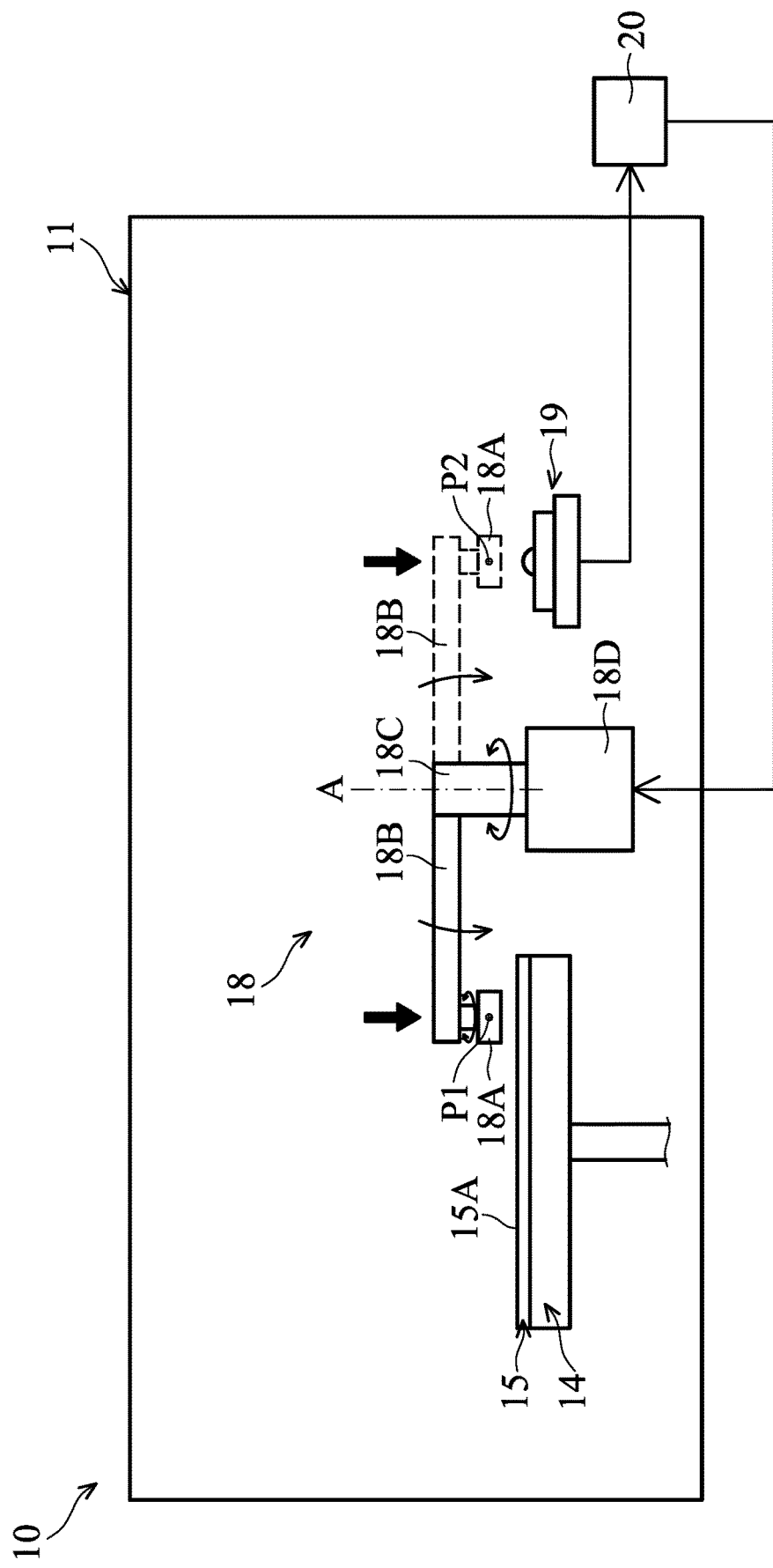
FIG. 2 schematically illustrates a pad conditioner that is movable between a conditioning position and a home position, and a measurement tool is provided beneath the pad conditioner at the home position for measuring the downward force thereof, in accordance with some embodiments.

In accordance with some embodiments, as shown in FIG. 2, the conditioning disk 18A is mounted on one end of a pivotable arm 18B, and a driving shaft 18C is coupled to the other end of the pivotable arm 18B and a motor housing 18D. The motor housing 18D houses a rotating motor (not shown) that is used to drive the driving shaft 18C to rotate along the central axis A, so that the pivotable arm 18B and the conditioning disk 18A can sweep back and forth across the polishing surface 15A (FIG. 1) during the CMP process. In addition, transmission assemblies (not shown) including a belt, pulleys, and the like, for example, are provided in the driving shaft 18C and pivotable arm 18B, and hence the rotating motor in the motor housing 18D can also drive the conditioning disk 18A to rotate over the polishing surface 15A through the transmission assemblies, during the CMP process.

In accordance with some embodiments, as shown in FIG. 2, the conditioning disk 18A and the pivotable arm 18B driven by the driving shaft 18C are movable between a conditioning position P1 over the polishing surface 15A and a home position P2 away from the polishing surface 15A. The pad conditioner 18 performs the conditioning process as described above to condition the polishing surface 15A at the conditioning position P1 and parks or rests at the home position P2 after the conditioning process (e.g. at the interval between polishing processes of two successive wafers).

In accordance with some embodiments, the pad conditioner 18 also applies downward force to the polishing surface 15A to condition the polishing surface 15A at the conditioning position P1, according to a predetermined downward force (value) indicated by a controller (which will be described later). For example, the pivotable arm 18B is bent downward by a pressured air system (not shown) or similar actuating devices controlled by the controller, so that the conditioning disk 18A is pressed against the polishing surface 15A to apply downward force to condition the polishing surface 15A. It should be noted that the downward force of the pad conditioner 18 is an important processing factor which may affect the roughness and cleanliness of the polishing surface 15A, as well as the polishing rate (also known as the CMP rate) of the CMP apparatus 10. When the downward force of the pad conditioner 18 (i.e., the downward force actually applied by the pad conditioner) is unstable during the continuous CMP process, difficulty in controlling thickness of the polished layers on the wafers can result. Furthermore, the debris removal efficiency of the pad conditioner 18 is also reduced which may cause the polished debris or undesirable by-products remained on the polishing surface 15A to re-stain on the wafers, resulting in defects on the wafers after the CMP process.

To monitor the downward force of the pad conditioner 18 (i.e., the downward force actually applied by the pad conditioner) during the CMP process, a measurement tool 19 is provided in the processing chamber 11. In accordance with some embodiments, as shown in FIG. 2, the measurement tool 19 is disposed beneath the pad conditioner 18 at the home position P2. Once the conditioning process is completed and the pad conditioner 18 moves back to the home position P2, the pad conditioner 18 can apply downward force to the measurement tool 19 according to the predetermined downward force value indicated by the controller, and the measurement tool 19 determines the downward force actually applied by the pad conditioner 18 accordingly. Afterwards, the measurement tool 19 provides the detected downward force information to a controller 20 (e.g. a fault detection and classification system) coupled to the measurement tool 19 and pad conditioner 18, and the controller 20 can adjust the downward force of the pad conditioner 18 in response to the input from the measurement tool 19, which will be illustrated in more detail later. Therefore, the pad conditioner 18 can have a stable downward force during the continuous CMP process and the yield of the CMP process is also improved.

Figure 3:
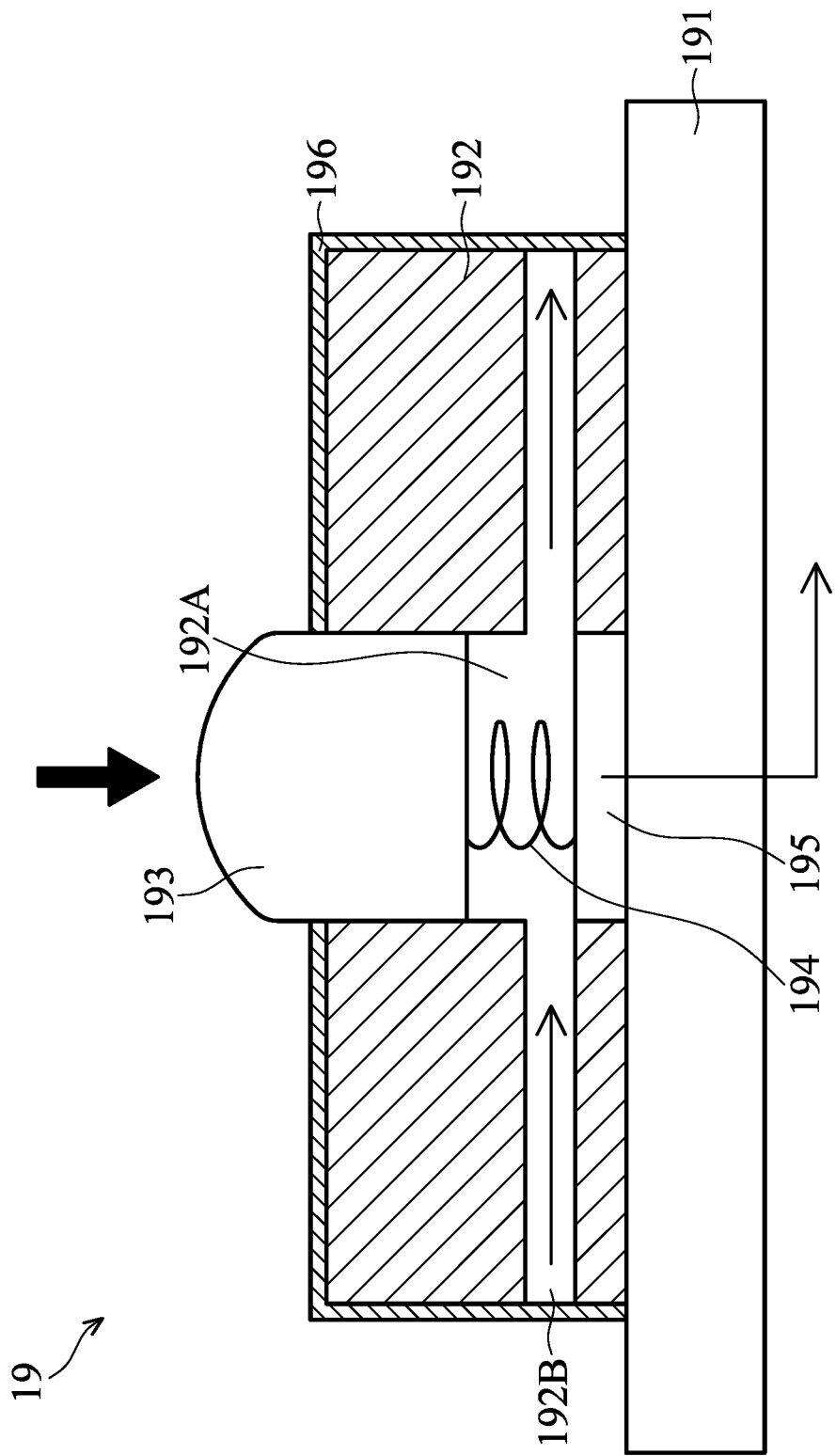
FIG. 3 schematically illustrates the internal configuration of a measurement tool in accordance with some embodiments.
Figure 4A:
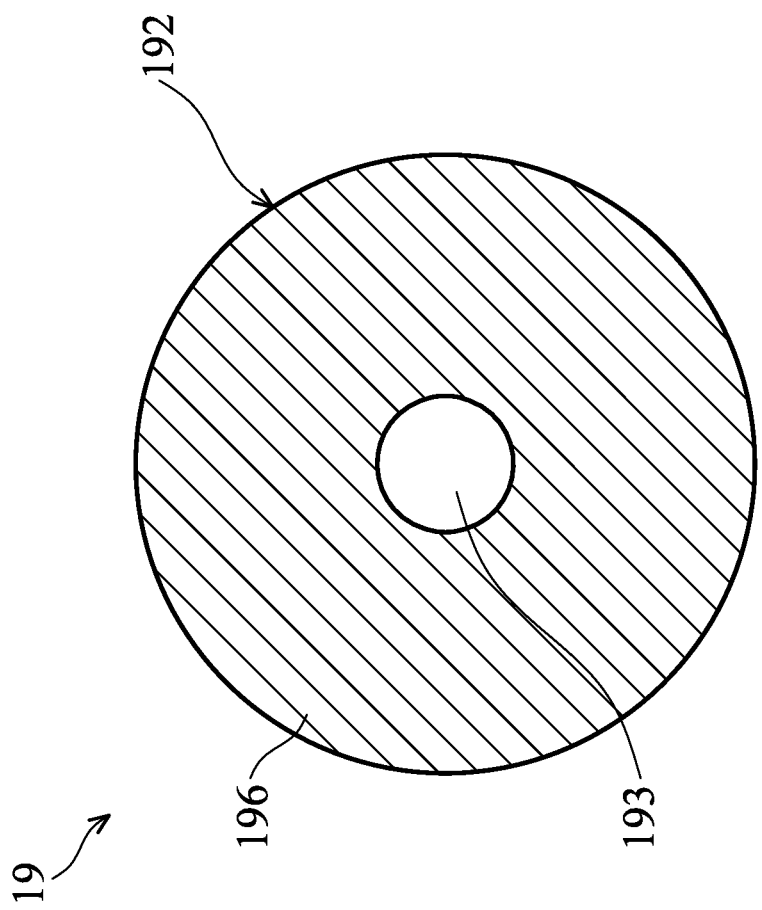
FIG. 4A schematically illustrates the top view of a part of a measurement tool in accordance with some embodiments.

FIG. 3 schematically illustrates the internal configuration of the measurement tool 19 in accordance with some embodiments. FIG. 4A schematically illustrates the top view of a part of the measurement tool 19 in accordance with some embodiments. As shown in FIG. 3 and FIG. 4A, the measurement tool 19 includes a holder 191, a frame 192, a button 193, a spring 194, and a pressure transducer 195. It should be appreciated that some additional elements can be added into the measurement tool 19, and some of the elements described below can be replaced or eliminated in other embodiments of the measurement tool 19.

The holder 191 is configured to support the components of the measurement tool 19 in the processing chamber 11 (FIG. 2). The frame 192 is disposed over the holder 191 and configured to receive the pressure transducer 195 therein to prevent the pressure transducer 195 from being exposed to the wet and corrosive environment in the processing chamber 11. In accordance with some embodiments, as shown in FIG. 3, a receiving space 192A (e.g. a recess) is formed in the frame 192 by mechanical drilling, for example, and the pressure transducer 195 is fixedly disposed at the bottom of the receiving space 192A. The button 193 is installed in the receiving space 192A and exposed from the frame 192 to be pressed by the pad conditioner 18 (as depicted by the downward arrow in FIG. 3). The width of the button 193 may be substantially the same as that of the receiving space 192A so as to cover the receiving space 192A by the button 193. In addition, the sidewall of the receiving space 192A can guide the movement of the button 193 in the receiving space 192A. The spring 194 (e.g. a compression spring) is disposed between and connects to the button 193 and the pressure transducer 195.

With the above configuration, when the pad conditioner 18 presses down the button 193 at the home position P2 (FIG. 2), the pressure transducer 195 can detect the downward force of the pad conditioner 18 based on the pressure from the button 193 and also provides an electric signal related to the amount of the downward force of the pad conditioner 18 to the controller 20. The pressure transducer 195 may comprise various conventional pressure transducers (e.g. pressure-electric type) that can convert a certain value of pressure into its corresponding electrical output signal. The spring 194 can then push the button 193 upward back to the original position after the downward force from the pad conditioner 18 is released.

Figure 4B:
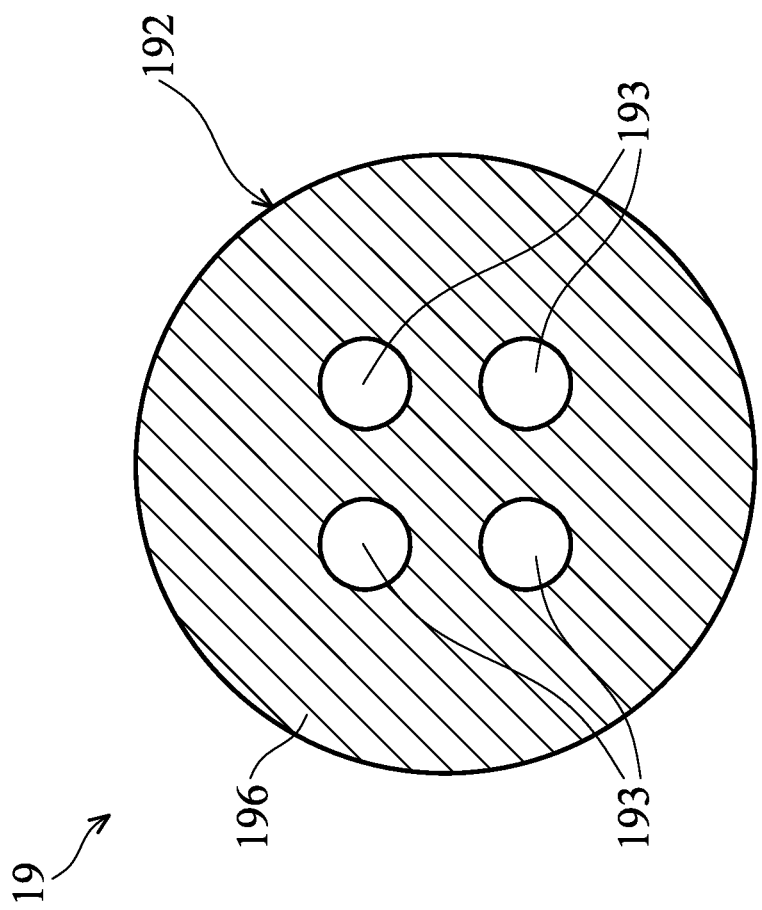
FIG. 4B schematically illustrates the top view of a part of a measurement tool in accordance with some embodiments.

FIG. 4B schematically illustrates the top view of a part of the measurement tool 19 in accordance with other some embodiments. As shown in FIG. 4B, multiple buttons 193 are provided and exposed from the frame 192 to be pressed by the pad conditioner 18 at the same time. Accordingly, the downward force of the pad conditioner 18 is evenly applied to the pressure transducer 195 via the buttons 193, and hence the measurement result of the pressure transducer 195 is more accurate. However, it should be noted that the buttons 193 may have other arbitrary numbers and arrangement patterns and are not limited to the embodiments in FIG. 4B.

In accordance with some embodiments, as shown in FIG. 3, the exposed surface of the frame 192 is coated with a protection layer 196 comprising an anti-corrosive material (for example, quartz, ceramic, or the like), to protect the frame 192 (e.g. made of stainless steel or the like) from the corrosive environment in the processing chamber 11. While not shown, the exposed surface of the button 193 (e.g. made of metal or plastic) is also coated with the protection layer 196 for protecting the button 193. In addition, at least one airflow channel 192B may be provided in the frame 192 to direct gas (e.g. inert gas) to pass through the pressure transducer 195 for removing excessive humidity which enters the frame 192 and keeping the pressure transducer 195 dry. While not shown, one end of the airflow channel 192B is coupled to a gas supply and the other end of the airflow channel 192B is coupled to an exhaust system. In accordance with some embodiments, a gas seal (not shown) made of rubber or the like may also be provided between the button 193 and the sidewall of the receiving space 192A to reduce the amount of corrosive gas or humidity that enters into the frame 192. Accordingly, the measurement tool 19 is suitable for being disposed in the processing chamber 11 to monitor the downward force of the pad conditioner 18 during the CMP process.

Figure 5:
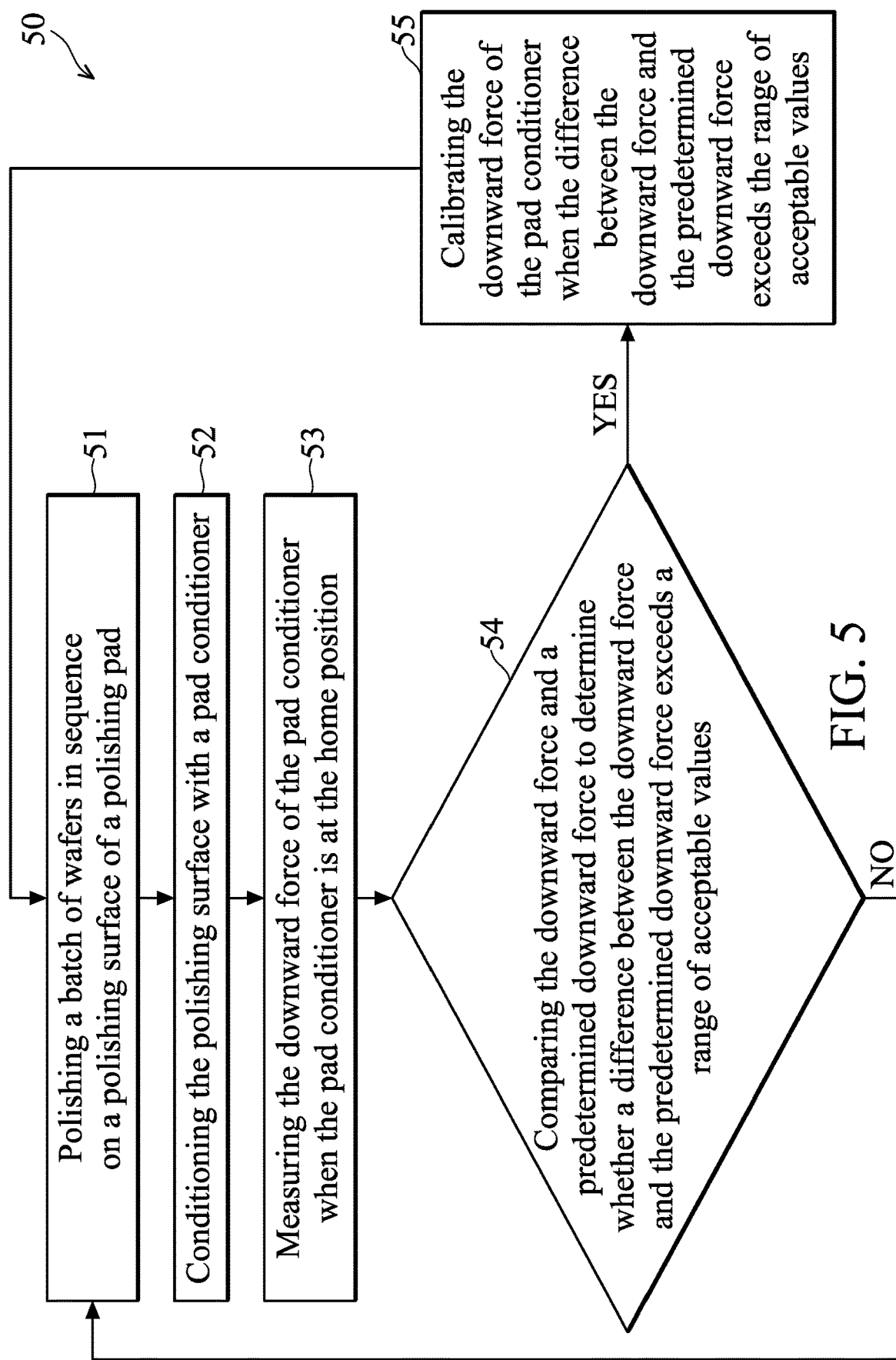
FIG. 5 is a simplified flow chart of a CMP method in accordance with some embodiments.

FIG. 5 is a simplified flow chart of a CMP method 50 in accordance with some embodiments. For illustration, the flow chart will be described along with the drawings shown in FIGS. 1, 2, and 6. Some of the operations described below can be replaced or eliminated in different embodiments. Alternatively, some operations may be added in different embodiments.

The CMP method 50 includes operation 51, in which a batch of semiconductor wafers (not shown in the figures) are sequentially polished on a polishing surface 15A of a polishing pad 15 in a CMP apparatus 10 during a CMP process, as shown in FIG. 1. During the CMP process, each wafer is held by a polishing head 16 in contact with and to be pressed against the polishing surface 15A for mechanical polishing as previously described. At the same time, a slurry dispenser 17 supplies slurry S onto the polishing surface 15A to create chemical reaction effect and mechanical polishing effect to achieve the planarization of the wafers.

The CMP method 50 further includes operation 52, in which a conditioning process is performed by a pad conditioner 18 to condition the polishing surface 15A, as shown in FIG. 1. During the conditioning process, the pad conditioner 18 sweeps back and forth across the polishing surface 15A for conditioning the polishing surface 15A. In addition, through driven by a pressured air system (not shown) or similar actuating devices, and according to the predetermined downward force value indicated by the controller, the pad conditioner 18 also applies downward force to condition the polishing surface 15A. In accordance with some embodiments, the conditioning process is performed during the polishing process of each of the wafers, i.e. known as concurrent conditioning, or after the polishing process of each of the wafers.

The conditioning process is typically performed in order to remove polished debris and undesirable by-products from the polishing surface 15A generated during the CMP process to maintain a consistent polishing rate of the polishing pad 15. However, although the controller has indicated a predetermined downward force, the downward force actually applied by the pad conditioner 18 may change (for example, an air leakage of the pressured air system may cause the downward force of the pad conditioner 18 to vary) during the continuous CMP process, so that the yield of the CMP process is adversely affected.

The CMP method 50 further includes operation 53, in which the downward force actually applied by the pad conditioner 18 is monitored during the CMP process by a measurement tool 19 provided in the processing chamber 11 of the CMP apparatus 10, as shown in FIG. 2. In accordance with some embodiments, after the conditioning process is completed, the pad conditioner 18 will move back to its home position P2 and wait for the next conditioning process. The measurement tool 19 is provided beneath the pad conditioner 18 at the home position P2 and configured to measure the downward force actually applied by the pad conditioner 18 to obtain a measured downward force, and also generates an electric signal related to the amount of the measured downward force of the pad conditioner 18 to a controller 20 (e.g. a fault detection and classification system), as described above.

In accordance with some embodiments, the measurement tool 19 measures the downward force of the pad conditioner 18 whenever the pad conditioner 18 moves back to the home position P2 after the conditioning process (e.g. at the interval between polishing processes of two successive wafers). In accordance with alternative embodiments, the measurement tool 19 measures the downward force of the pad conditioner 18 after a predetermined number of wafers have been polished, i.e. the measuring frequency for the downward force of the pad conditioner 18 can be predetermined and adjusted by users. In accordance with some embodiments, the controller 20 includes a computer and an I/O interface (not shown) for users to set up the measurement parameters (e.g. the measuring frequency).

Figure 6:
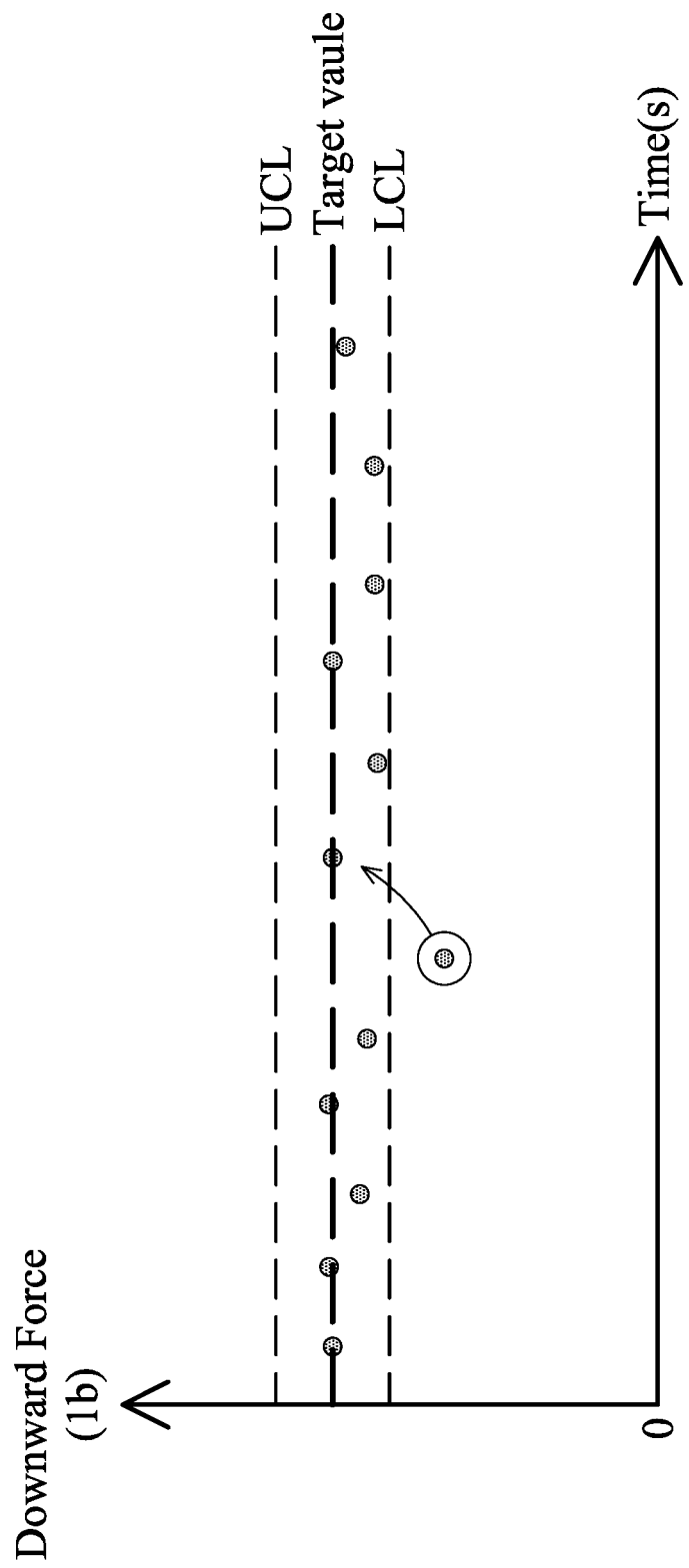
FIG. 6 is a diagram plotting downward force measurements in a CMP apparatus versus process time of a continuous CMP process, a target value, upper control limits and lower control limits, in accordance with some embodiments FIG. 7 schematically illustrates the internal configuration of a polishing head in accordance with some embodiments.

The CMP method 50 further includes operation 54, in which the measured downward force of the pad conditioner 18 from the measurement tool 19 and a predetermined downward force are compared to determine whether a difference between the measured downward force and the predetermined downward force exceeds a range of acceptable values. For example, before the measured downward force is analyzed by the controller 20 (or before the CMP process), the users may set up a predetermined target (downward force) value (for example, in pounds (lb)) and an allowable deviation value (for example, a few pounds), via the I/O interface, to the controller 20. In some embodiments, as shown in FIG. 6, upper control limit (UCL) is set at the target value plus the allowable deviation value, and lower control limit (LCL) is set at the target value subtract the allowable deviation value. The difference between the UCL and LCC is referred to as the range of acceptable values.

After the range of acceptable values for the difference between the measured downward force and the predetermined downward force (e.g. the target value) is determined, the controller 20 compares the downward force of the pad conditioner 18 measured by the measurement tool 19 and the predetermined downward force stored in the controller 20 to determine whether the difference therebetween is within the range of acceptable values.

After the comparison, if the difference between the measured downward force and the predetermined downward force is within (i.e. does not exceed) the range of acceptable values, the CMP method 50 repeats operations 51 to 54 until all semiconductor wafers W are processed. However, if the difference between the measured downward force and the predetermined downward force exceeds the range of acceptable values (as depicted by the circled portion in FIG. 6), the CMP method 50 continues with operation 55, in which the controller 20 feedback controls, for example, the pressured air system coupled to the pad conditioner 18, to calibrate the downward force actually applied by the pad conditioner 18 to the (predetermined) target downward force. Afterwards, the CMP method 50 repeats operations 51 to 54 until all semiconductor wafers S are processed or further re-calibrates the downward force of the pad conditioner 18 (i.e.

operation 55) when the difference between the measured downward force and the predetermined downward force exceeds the range of acceptable values again.

In accordance with alternative embodiments, the CMP method 50 may further comprise an operation of indicating an alarm condition by the controller 20 when the calibration of the downward force of the pad conditioner 18 occurs many times (for example, more than five times). It should be appreciated that the air leakage of the pressured air system occurs many times can indicate a fault or abnormality situation in the pressured air system. Therefore, the controller 20 triggers an alarm condition and notifies the users of the CMP apparatus 10 to do maintenance or repair the abnormal pressured air system, so that the air leakage issue is remedied early.

As the downward force of the pad conditioner 18 can be dynamically adjusted by the controller 20, the debris removal efficiency of the pad conditioner 18 remains consistent during the continuous CMP process. Therefore, the yield of the CMP process is improved (for example, the defects on the wafers after the CMP process are reduced) and the lifetime of the polishing pad 15 is also prolonged. Furthermore, since the downward force of the pad conditioner 18 is detected while the pad conditioner 18 parks at its home position, the CMP processing sequence is not changed and the CMP processing time is not increased.

In the present disclosure, additional features can be provided into embodiments of the CMP apparatus 10 in order to reduce polished debris and undesirable by-products remained on the polishing surface 15A of the polishing pad 15 (i.e. maintain the cleanliness of the polishing surface 15A) during or after the CMP process.

Figure 7:
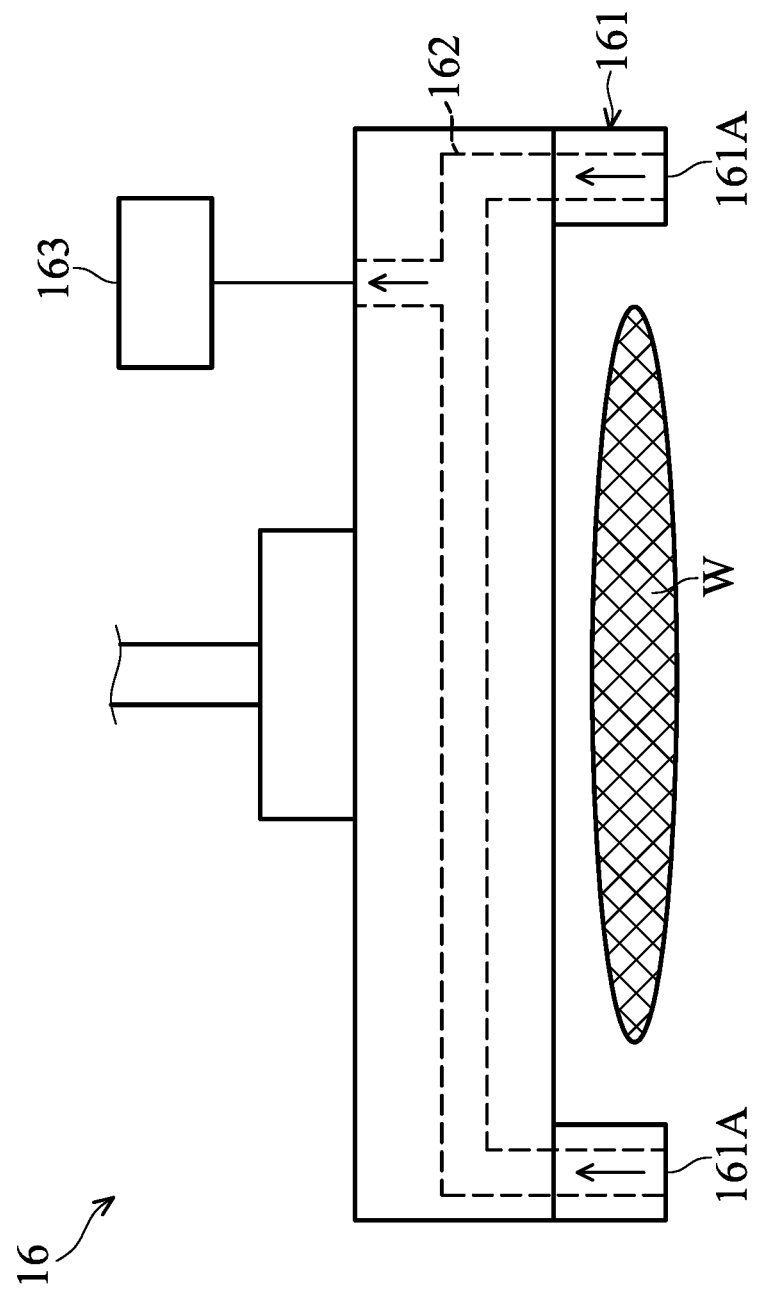
Figure 8:
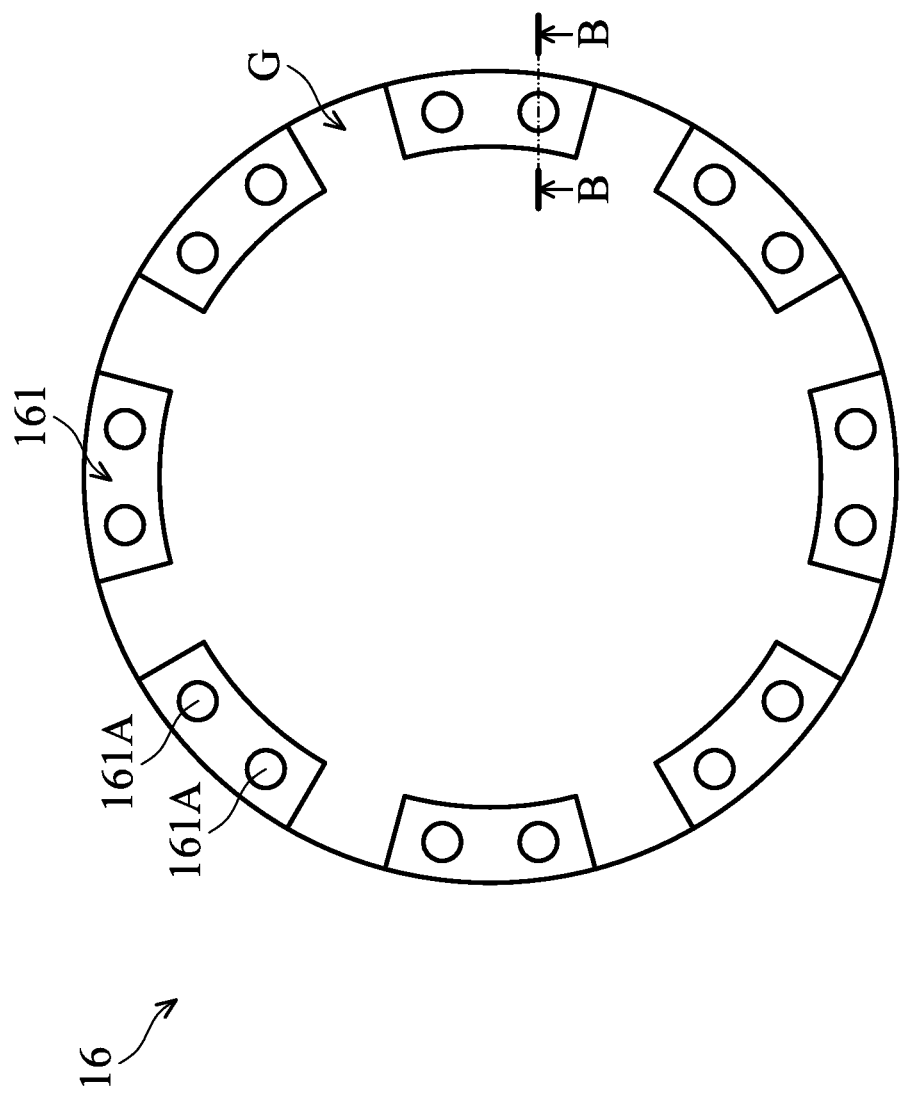
FIG. 8 schematically illustrates the bottom view of the polishing head in FIG. 7.

For example, the retaining ring 161 of the polishing head 16 may further form a plurality of holes 161A on the bottom surface thereof that faces the polishing surface 15A (FIG. 1), as shown in FIGS. 7 and 8. In addition, at least one fluid channel 162 is provided in the polishing head 16 and fluidly connects to the holes 161A and an exhaust system 163 (e.g. comprising a vacuum pump) that can produce vacuum suction. By vacuuming the fluid channel 162 as the retaining ring 161 is pressed against the polishing surface 15A, polished debris and CMP by-products can also be removed from the polishing surface 15A via the holes 161A, in addition to the sweeping removal performed by the pad conditioner 18. Therefore, it can improve the cleanliness of the polishing surface 15A and reduce the chance of polished debris and undesirable by-products remaining on the polishing surface 15A to re-stain on the wafer W during the CMP process.

In accordance with some embodiments, the holes 161A are formed on the retaining ring 161 by mechanical drilling or other available techniques. The holes 161A may be circular, triangular, square, elliptical, or another shape. In accordance with some embodiments, the holes 161A are arranged on the circular retaining ring 161 in a regular (for example, with a uniform hole-to-hole interval) or irregular manner. In addition, the size of the holes 161A may be chosen so that aggregated debris or particles remaining on the polishing surface 15A can be successfully removed. In accordance with some embodiments, the fluid channel 162 is a pipeline arranged in a circle to connect to the holes 161A.

Figure 9:
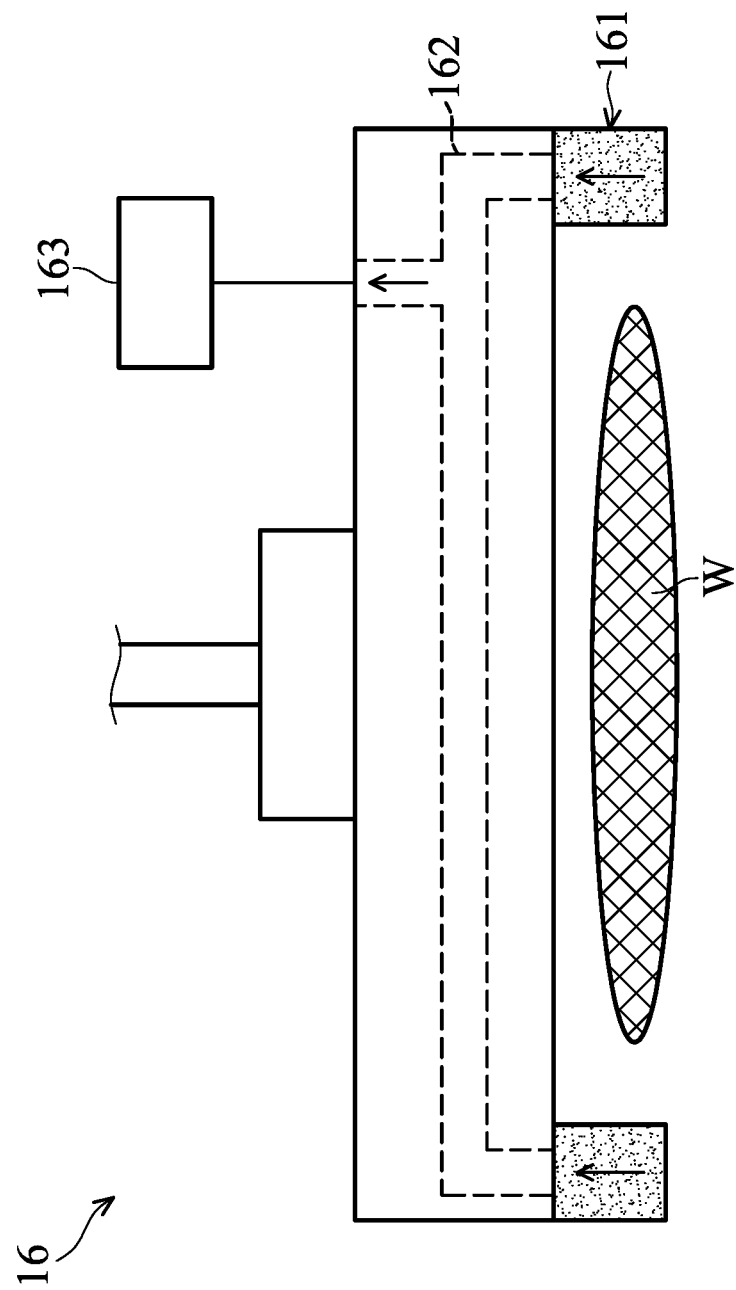
FIG. 9 schematically illustrates that the retaining ring of the polishing head has a porous structure in accordance with some embodiments.

In accordance with alternative embodiments, the holes 161A may be omitted, and the retaining ring 161 is formed of a porous material containing pores that allow fluid to pass through, as shown in FIG. 9. The fluid channel 162 provided in the polishing head 16 also fluidly connects the retaining ring 161 and the exhaust system 163. In this way, polished debris and CMP by-products can also be removed from the polishing surface 15A by vacuum suction via the pores in the retaining ring 161, in addition to the sweeping removal performed by the pad conditioner 18. The retaining ring 161 having a porous structure may be formed by sintering or another available technique.

Figure 10:
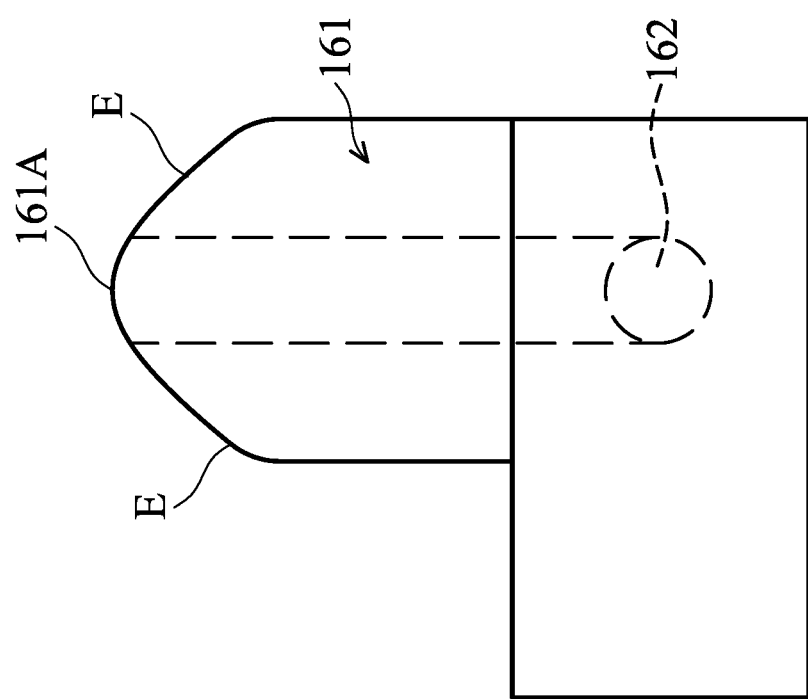
FIG. 10 is a cross-sectional view taken along the line B-B in FIG. 8.

In accordance with some embodiments, as shown in FIG. 10, the edges E of the retaining ring 16 which may contact the polishing surface 15A (FIG. 1) during the polishing process are further designed as curved shapes (such as round or arc shape), in order to reduce damage to the retaining ring 16 due to the friction between the polishing surface 15A and the retaining ring 16. Therefore, polished debris and undesirable by-products generated during the CMP process can also be reduced.

Figure 11:
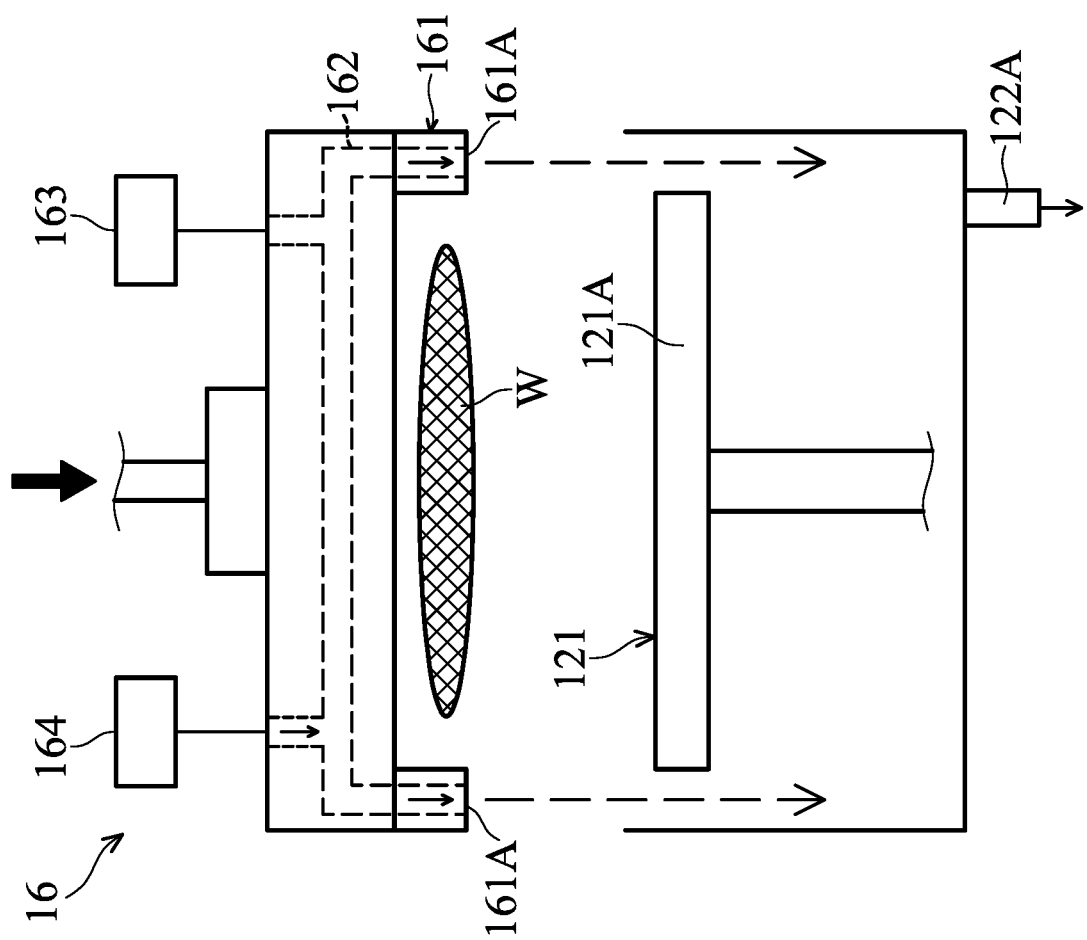
FIG. 11 schematically illustrates that a washing solution supply system is coupled to the polishing head, and the polishing head performs a self-cleaning process while it moves over the wafer load/unload station after the polishing process.

In accordance with some embodiments, as shown in FIG. 11, a washing solution supply system 164 (e.g. comprising a pump and a reservoir for holding a washing solution) is further provided to fluidly connect the fluid channel 162 in the polishing head 16. After the polishing process, the washing solution supply system 164 is used to supply a washing solution, such as de-ionized water or another available chemical cleaner, to flow though the fluid channel 162 and exit the polishing head 16 from the holes 161A on the retaining ring 161, so as to clean the fluid channel 162 and prevent contaminants (i.e. polished debris and CMP by-products) from accumulating in the fluid channel 162. Accordingly, it can reduce the chance that the contaminants in the fluid channel 162 will move back to the polishing surface 15A.

In accordance with some embodiments, the polishing head 16 performs the above self-cleaning process to clean the fluid channel 162 while it moves over the wafer load/unload station 12 after the polishing process. As shown in FIG. 11, the wafer load/unload station 12 includes a tank 122 configured to collect the dirty washing solution from the polishing head 16. One port 122A is provided on the bottom of the tank 122 and coupled to a discharge system for removing the washing solution in the tank 122. A stage unit 121 is also provided in the tank 122 and configured for the loading and unloading of wafers W onto and from the polishing pad 15 via the polishing head 16, as described above. While not shown, the stage unit 121 is driven by a mechanism, such as a Z-axis motor, to transfer a wafer W to the polishing head 16 or receive a wafer W transferred from the polishing head 16.

Figure 12:
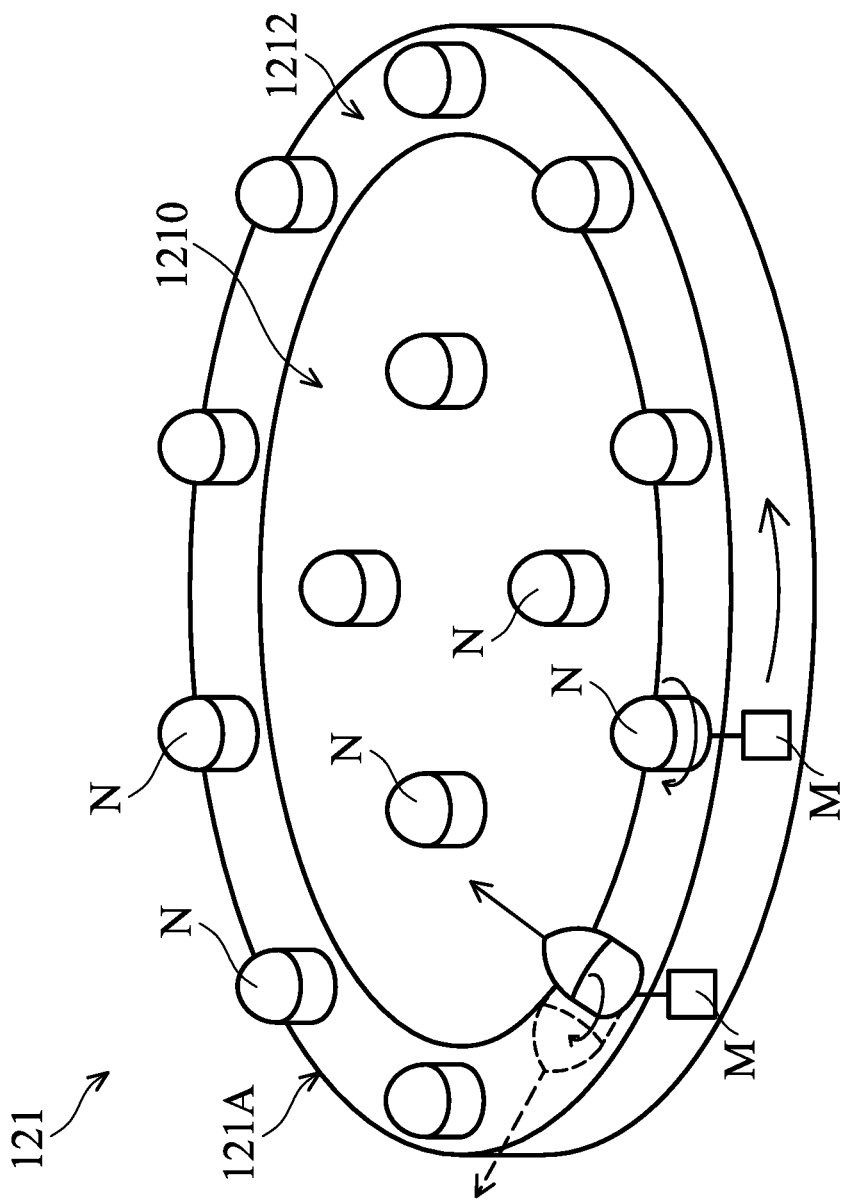
FIG. 12 schematically illustrates the stage body of a stage unit of a wafer load/unload station having a plurality of spraying nozzles in accordance with some embodiments.

In accordance with some embodiments, as shown in FIGS. 11 and 12, the stage body 121A of the stage unit 121 includes a plurality of spraying nozzles N that are used to supply a washing solution (e.g. de-ionized water or another available chemical cleaner) to clean the wafer W and the retaining ring 161 of the polishing head 16. In other words, the stage unit 121 can also serve as a clean unit for cleaning the polished surface of the wafer W and the retaining ring 161 after the CMP process. While not shown, the spraying nozzles N may be retracted into the stage body 121A (i.e. does not protrude above the surface of the stage body 121A) while a wafer W is ready to be placed on the stage body 121A.

In accordance with some embodiments, as shown in FIG. 12, the stage body 121A includes a circular inner portion 1210 and an annular outer portion 1212 surrounding the inner portion 1210. The diameter of the inner portion 1210 may correspond to that of the wafer W (FIG. 11), and the outer diameter of the outer portion 1212 may correspond to that of the retaining ring 161 (FIG. 11). The spraying nozzles N are provided in the inner portion 1210 and outer portion 1212. In accordance with some embodiments, the spraying nozzles N are evenly distributed in the inner portion 1210 and outer portion 1212, as shown in FIG. 12, for example. The number and position of the spraying nozzles N are chosen so that the spraying nozzles N can dispense a washing solution onto the entire wafer W and the retaining ring 161.

While not shown, the spraying nozzles N are coupled to a washing solution supply system via at least one pipeline or tube provided in the stage body 121A. In addition, a heater (not shown) may also be provided in the stage body 121A in some embodiments, in order to heat the washing solution flowing through the pipeline, so that the heated washing solution supplied by the spraying nozzles N has a desirable temperature for effectively removing the contaminants on the wafer W and the retaining ring 161. The spraying nozzles N may comprise ceramics, quartz, or any other anti-corrosive materials (such as plastic). However, it should be appreciated that many variations and modifications can be made to the embodiments of the disclosure.

In accordance with some embodiments, the outer portion 1212 is rotatable with respect to the inner portion 1210 (i.e. the outer portion 1212 can rotate along the central axis of the stage body 121A while the inner portion 1210 is fixed), so that the spraying nozzles N in the outer portion 1212 can clean the entire retaining ring 161 (and all the grooves G (see FIG. 8)) to reduce contaminants remained on the retaining ring 161. The outer portion 1212 may be rotated by a rotating motor, gears, and the like in some embodiments.

In accordance with some embodiments, the spraying direction of each spraying nozzle N is arranged so that the spraying nozzles N can dispense a washing solution onto the entire wafer W and the retaining ring 161 (i.e. the spraying direction of each spraying nozzle N can be adjusted to be vertical or inclined by any angle with respect to the wafer W and the retaining ring 161 based on actual requirements, and the spraying nozzles N may have different spraying directions). In accordance with alternative embodiments, the stage unit 121 further includes a plurality of rotation motors M provided in the stage body 121A and coupled to the spraying nozzles N. The rotation motors M can control the spraying direction of the respective spraying nozzle N (e.g. allow the spraying nozzles N, either in the inner portion 1210 or the outer portion 1212, to spray a washing solution in a rotating manner, as shown in FIG. 12) to enlarge the spray region of each spraying nozzle N.

Figure 13:
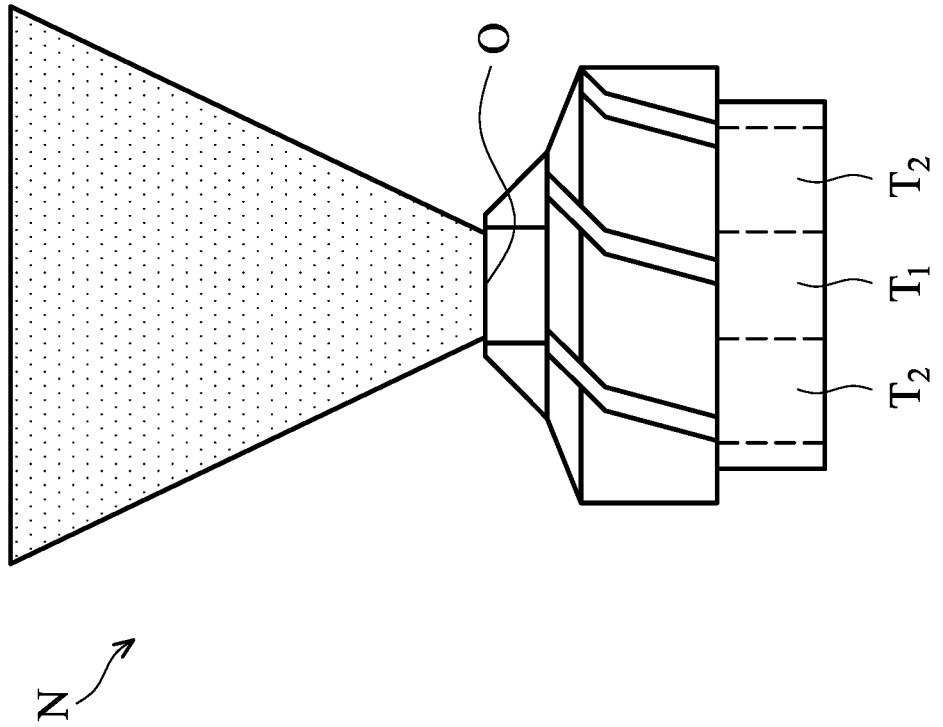
FIG. 13 is a cross-sectional view of a spraying nozzle in accordance with some embodiments.

Various spraying shapes of the washing solution, including a jet shape, a fan shape, a mist shape, or the like, can also be generated by the spraying nozzles N. In accordance with some embodiments, as shown in FIG. 13, the spraying nozzle N has a rounded nozzle hole O, a first inner path T1, and a second inner path T2 surrounding the first inner path T1. The first inner path T1 is fluidly connected to a gas source in the washing solution supply system (not shown) which is used to supply N2 or other inert gas, and the second inner path T2 is fluidly connected to a liquid source in the washing solution supply system (not shown). With this configuration, the washing solution sprayed by the nozzle hole O may have various spray shapes due to the mixing of the inert gas in the first inner path T1 with the washing solution in the second inner path T2. For example, the spraying nozzle N may spray the washing solution with a fan shape (as shown in FIG. 13) when the gas source has a medium pressure such as 50 to 250 psi. Alternatively, the spraying nozzle N may spray the washing solution with a jet shape when the gas source has a higher pressure such as 250 to 1000 psi, or spray the washing solution with a mist shape when the gas source has a lower pressure such as 10 to 50 psi. However, it should be appreciated that the spraying nozzles N may also include several configurations and are not limited to the embodiments described above.

The embodiments of the present disclosure have some advantageous features: The CMP apparatus uses a measurement tool to monitor the downward force of the pad conditioner while it moves back to the home position (e.g. at the interval between polishing processes of two successive wafers) and a controller to feedback control and dynamically calibrate the downward force of the pad conditioner during the continuous CMP process in response to measurement result from the measurement tool. Therefore, the debris removal efficiency of the pad conditioner remains consistent during the continuous CMP process, and hence the polished debris and undesirable by-products can be successfully removed from the polishing pad during the CMP process and the yield of the CMP process is also improved (e.g. the polished thickness of a batch of wafers is consistent and the defects on the wafers are reduced). In addition, the polishing head can help to remove the polished debris and undesirable by-products from the polishing pad via the vacuum holes provided on the bottom surface of the retaining ring. In addition, several spraying nozzles are provided on the stage unit of the wafer load/unload station to supply a washing solution to clean the polished head and the retaining ring of polishing head after the CMP process, and hence the yield of the CMP process is further improved.

In some embodiments, a chemical mechanical polishing (CMP) apparatus is provided. The CMP apparatus includes a polishing pad and a polishing head. The polishing pad has a polishing surface. The polishing head is configured to hold a wafer in contact with the polishing surface during the polishing process. The polishing head includes a retaining ring, at least one fluid channel, and a vacuum pump. The retaining ring is arranged along the periphery of the polishing head and configured to retain the wafer. The at least one fluid channel is provided inside the polishing head, wherein the retaining ring includes a bottom surface facing the polishing surface and a plurality of holes in fluid communication with the bottom surface and the at least one fluid channel. The vacuum pump is fluidly coupled to the at least one fluid channel.

In some embodiments, a CMP apparatus is provided. The CMP apparatus includes a polishing pad, a polishing head, and a washing solution supply system. The polishing pad has a polishing surface. The polishing head is configured to hold a wafer in contact with the polishing surface during the polishing process. The polishing head includes a retaining ring, at least one fluid channel, and an exhaust system. The retaining ring is disposed on the bottom of the polishing head and configured to retain the wafer. The at least one fluid channel is formed in the polishing head and fluidly connected to a plurality of vacuum holes formed on the bottom surface of the retaining ring facing the polishing surface. The exhaust system is fluidly connected to the at least one fluid channel, wherein the exhaust system is configured to generate a vacuum in the at least one fluid channel to absorb contaminants on the polishing surface via the vacuum holes. The washing solution supply system is fluidly connected to the at least one fluid channel, wherein the washing solution supply system is configured to supply a washing solution to flow through the at least one fluid channel and exit the polishing head via the holes.

In some embodiments, a CMP apparatus method is provided. The CMP method includes pressing a wafer against a polishing surface of a polishing pad with a polishing head during the polishing process. The polishing head includes a retaining ring configured to retain the wafer and including holes adjacent to the polishing surface, and at least one fluid channel inside the polishing head and fluidly connected with the holes. The CMP method also includes drawing contaminants on the polishing surface into the at least one fluid channel through the holes of the polishing head during the polishing process.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A chemical mechanical polishing (CMP) apparatus, comprising:
    a polishing pad having a polishing surface;
    a polishing head configured to hold a wafer in contact with the polishing surface during a polishing process, wherein the polishing head comprises:
        a retaining ring arranged along a periphery of the polishing head and configured to retain the wafer;
        at least one fluid channel provided inside the polishing head, wherein the retaining ring comprises a bottom surface facing the polishing surface and a plurality of holes in fluid communication with the bottom surface and the at least one fluid channel; and
        a vacuum pump fluidly coupled to the at least one fluid channel; and
    a washing solution supply system fluidly connected to the at least one fluid channel and configured to supply a washing solution to clean the at least one fluid channel.

2. The CMP apparatus as claimed in claim 1, wherein the plurality of holes is formed on the bottom surface of the retaining ring.

3. The CMP apparatus as claimed in claim 1, wherein the retaining ring comprises a porous material.

4. The CMP apparatus as claimed in claim 1, further comprising:
    a slurry dispenser configured to dispense slurry onto the polishing surface during the polishing process, and wherein the polishing head further comprises a plurality of grooves formed on the bottom surface of the retaining ring, wherein the plurality of grooves are formed to extend through an inner sidewall and an outer sidewall of retaining ring to allow the slurry to flow into a space between the wafer and the polishing surface.

5. The CMP apparatus as claimed in claim 1, wherein edges of the retaining ring adjacent to the polishing pad are curved shaped in a vertical cross-sectional view.

6. The CMP apparatus as claimed in claim 1, further comprising:
    a tank configured to collect the washing solution from the polishing head while the polishing head moves over the tank after the polishing process.

7. The CMP apparatus as claimed in claim 6, further comprising:
    a stage unit disposed in the tank, wherein the stage unit includes a plurality of spraying nozzles configured to supply a second washing solution to the wafer and the retaining ring of the polishing head.

8. The CMP apparatus as claimed in claim 7, wherein the spraying nozzles are disposed in an inner portion and an outer portion of the stage unit, and the outer portion is rotatable with respect to the inner portion.

9. The CMP apparatus as claimed in claim 7, wherein the stage unit further comprises a plurality of rotation motors configured to control a spraying direction of the respective spraying nozzle.

10. A chemical mechanical polishing (CMP) apparatus, comprising:
    a polishing pad having a polishing surface;
    a polishing head configured to hold a wafer in contact with the polishing surface during a polishing process, wherein the polishing head comprises:
        a retaining ring disposed on a bottom of the polishing head and configured to retain the wafer;
        at least one fluid channel formed in the polishing head and fluidly connected to a plurality of vacuum holes formed on a bottom surface of the retaining ring facing the polishing surface; and
        an exhaust system fluidly connected to the at least one fluid channel, wherein the exhaust system is configured to generate a vacuum in the at least one fluid channel to absorb contaminants on the polishing surface via the plurality of vacuum holes; and
    a washing solution supply system fluidly connected to the at least one fluid channel, wherein the washing solution supply system is configured to supply a washing solution to flow through the at least one fluid channel and exit the polishing head via the plurality of holes.

11. The CMP apparatus as claimed in claim 10, wherein in a plan view, the plurality of vacuum holes is located away from an inner sidewall and an outer sidewall of the retaining ring, respectively.

12. The CMP apparatus as claimed in claim 10, further comprising:
    a tank configured to collect the washing solution discharged from the at least one fluid channel through the plurality of vacuum holes while the polishing head is positioned over the tank.

13. The CMP apparatus as claimed in claim 12, further comprising:
    a cleaning unit in the tank, comprising:
        a stage;
        a plurality of spraying nozzles provided on the stage and configured to dispense a second washing solution onto the wafer and the retaining ring in a jet shape, a fan shape or a mist shape.

14. The CMP apparatus as claimed in claim 13, wherein the cleaning unit further comprises a plurality of rotation motors configured to control a spraying direction of the respective spraying nozzle.

15. A chemical mechanical polishing (CMP) method, comprising:
    pressing a wafer against a polishing surface of a polishing pad with a polishing head during a polishing process, wherein the polishing head comprises a retaining ring configured to retain the wafer and comprising holes adjacent to the polishing surface, and at least one fluid channel inside the polishing head and fluidly connected with the holes;
    drawing contaminants on the polishing surface into the at least one fluid channel through the holes of the polishing head during the polishing process; and
    supplying a washing solution into the at least one fluid channel to clean the at least one fluid channel after the polishing process, wherein the washing solution flows out of the at least one fluid channel from the holes of the retaining ring.

16. The CMP method as claimed in claim 15, wherein the drawing comprises vacuuming the at least one fluid channel with a vacuum pump.

17. The CMP method as claimed in claim 15, wherein the holes are formed on a bottom surface of the retaining ring facing the polishing surface.

18. The CMP method as claimed in claim 15, wherein the retaining ring is formed of a porous material.

19. The CMP method as claimed in claim 15, further comprising:
    collecting the washing solution from the polishing head using a tank while the polishing head moves over the tank after the polishing process.

20. The CMP method as claimed in claim 19, wherein the tank includes a stage unit therein, and the stage unit includes a plurality of spraying nozzles configured to supply a second washing solution to the wafer and the retaining ring of the polishing head.

* * * * *